United States Patent [19]

Spitzer

[11] Patent Number: 5,241,555
[45] Date of Patent: Aug. 31, 1993

[54] SEMICONDUCTOR SINGLE CRYSTAL EXTERNAL RING RESONATOR CAVITY LASER AND GYROSCOPE

[76] Inventor: Mark B. Spitzer, 5 Mink Trap La., Sharon, Mass. 02067

[21] Appl. No.: 782,996

[22] Filed: Oct. 28, 1991

[51] Int. Cl.[5] .............................................. H01S 3/083
[52] U.S. Cl. .................................................... 372/94
[58] Field of Search .................................... 372/94, 43

[56] References Cited

U.S. PATENT DOCUMENTS

| | | | |
|---|---|---|---|
| 4,792,962 | 12/1988 | Miyauchi et al. | 372/94 |
| 4,850,708 | 7/1989 | Moore et al. | 372/94 |
| 4,851,368 | 7/1989 | Behfar-Rad et al. | 372/94 |
| 4,884,283 | 11/1989 | Rahn et al. | 372/94 |
| 4,924,476 | 5/1990 | Behfar-Rad et al. | 372/94 |
| 4,986,661 | 1/1991 | Vick | 372/94 |
| 5,031,190 | 7/1991 | Behfar-Rad | 372/94 |
| 5,043,996 | 8/1991 | Nilsson et al. | 372/94 |
| 5,118,189 | 6/1992 | Sanders et al. | 372/94 |

Primary Examiner—John D. Lee
Assistant Examiner—Robert E. Wise
Attorney, Agent, or Firm—Iandiorio & Dingman

[57] ABSTRACT

A ring laser is disclosed including a semiconductor single crystal external ring resonator cavity having a plurality of reflecting surfaces defined by the planes of the crystal and establishing a closed optical path; and a discrete laser medium disposed in said semiconductor single crystal external ring resonator cavity for generating coherent light in the cavity.

19 Claims, 5 Drawing Sheets

SEMICONDUCTOR SINGLE CRYSTAL EXTERNAL RING RESONATOR CAVITY LASER AND GYROSCOPE

FIELD OF INVENTION

This invention relates to a semiconductor single crystal external ring resonator cavity laser and gyroscope.

BACKGROUND OF INVENTION

Conventional ring lasers are relatively large in size, typically occupying a cylindrical volume of three inches in diameter and four inches high. Smaller ring lasers are desirable, especially for ring lasers used in gyroscopes. Smaller ring lasers and ring laser gyroscopes could benefit from integrated unit chip technology fabrication. Some miniaturization has been accomplished by using an epitaxial semiconductor such as GaAs and GaAlAs to function both as the lasing medium and the cavity. This is done by cleaving the semiconductor along four facets which serve as the cavity reflecting surfaces for the laser beam. See "Grating-Coupled GaAs Single Heterostructure Ring Laser" by D. R. Scifres, R. D. Burhnam and W. Streifer, *Applied Physics Letters*, Vol. 28, No. 11, Jun. 1, 1976; and U.S. Pat. No. 4,792,962, issued Dec. 20, 1988, Miyauchi et al., "A Ring-Shaped Resonator Type Semiconductor Laser Device". One shortcoming with such devices is that the expensive lasing medium is used not only to form the gain region, but also to form the entire resonator cavity; however, the lasing medium is only necessary for the lasing action where optical gain is desired. Also the geometry of the lasing medium and of the cavity are constrained by each other, as is the material used for them. The fact that the lasing medium and the cavity are one and the same material and structure militates against enlarging the cavity to improve the laser gyroscope sensitivity since the lasing medium necessarily will be enlarged too. In addition, the coupled nature of the cavity and the laser medium increases the difficulty of forming a laser that can support bidirectional propagation modes (clockwise and counterclockwise), without mode competition. Further, since the entire crystal in such devices is also the laser gain medium, light amplification must take place throughout the entire extent of the optical path in the crystal, or the non-lasing portion of the medium will simply absorb the optical energy and suppress the ring laser action.

The laser medium and cavity can be decoupled to avoid some of these shortcomings for example by using an external cavity where a series of mirrors external to the laser constitute the cavity. See U.S. Pat. No. 4,405,236, issued Sep. 20, 1983, Mitsuhashi et al., "Semiconductor Ring Laser Apparatus". However, such external cavity arrangements are not well suited to miniaturization and the necessary precision alignment of the mirrors that define the ring cavity. Both the external and internal cavity designs provide optical outputs. The optical output signal must be converted to electrical output for further processing by external logic circuits.

SUMMARY OF INVENTION

It is therefore an object of this invention to provide an improved miniaturized ring laser.

It is a further object of this invention to provide such an improved ring laser in which the laser medium and cavity are decoupled: neither constrain the geometry or the material of the other.

It is a further object of this invention to provide such an improved ring laser which can be easily and less expensively fabricated in semiconductor material.

It is a further object of this invention to provide such an improved ring laser which admits of fabrication in conventional, miniature semiconductor chips.

It is a further object of this invention to provide such an improved ring laser in which the laser medium can be a gas, a liquid, or a solid.

It is a further object of this invention to provide such an improved ring laser which is less expensive since only a small portion needs to be lasing material.

It is a further object of this invention to provide such an improved ring laser which admits of more independent variation of the gain medium and cavity to obtain narrow spectral line width, and facilitates the incorporation of a laser that suports bidirectional propagation modes.

It is a further object of this invention to provide such an improved ring laser which requires light amplification in only a small part of the cavity.

It is a further object of this invention to provide such an improved ring laser which virtually eliminates the need for precision mechanical alignment of external mirrors while preserving the independence of the cavity and lasing medium.

It is a further object of this invention to provide such an improved ring laser which easily functions as a ring laser gyroscope based on the Sagnac effect.

It is a further object of this invention to provide such an improved ring laser gyroscope which can directly produce an electrical output as well as an optical output.

It is a further object of this invention to provide such an improved ring laser which maintains its alignment even under thermal, acceleration and vibration stress.

It is a further object of this invention to provide such an improved ring laser which can use the crystal planes of the material to obtain precise, ruggedly aligned cavity reflectors.

It is a further object of this invention to provide such an improved ring laser which can be formed of material which supports detector and on-board logic fabrication.

It is a further object of this invention to provide such an improved ring laser which can be made using conventional microelectronic fabrication processes.

The invention results from the realization that a truly effective miniaturized ring laser with the laser medium and cavity decoupled as to geometry and material can be achieved using a semiconductor single crystal external ring cavity whose reflecting surfaces are defined by planes of the crystal and establish a precise, rugged closed optical path in which the laser medium is disposed, and from the further realization that such a semiconductor single crystal external ring cavity can be made using conventional microelectronic fabrication processes, can embody on-board logic circuits and detectors, and can implement ring laser gyroscopes.

This invention may suitably comprise, consist of, or consist essentially of a ring laser including a semiconductor single crystal external ring resonator cavity having a plurality of reflecting surfaces defined by the planes of the crystal and establishing a closed optical path. A discrete laser medium is disposed within said semiconductor single crystal external ring resonator cavity for generating coherent light in the cavity.

In a preferred embodiment there may be two, three, four or more surfaces. If there are four reflecting surfaces, they may be arranged in orthogonal pairs of parallel spaced surfaces. The crystal planes may be the {110} planes. The laser medium may be a semiconductor material and it may be grown epitaxially on the semiconductor crystal. The cavity may include a gastight chamber and the laser medium may be a gas disposed in the chamber. The chamber may be coextensive with the cavity or may occupy only a portion of the cavity, and the chamber may include windows. There may be an index matching medium between the laser medium and the optical path. The laser medium may be oriented at Brewster's angle with respect to the optical path to virtually eliminate reflections and backscattering and the need for a matching medium. The optical path may extend through the semiconductor single crystal external ring resonator cavity, or there may be a channel in the semiconductor single crystal external ring resonator cavity and the optical cavity may extend through that channel. The reflecting surfaces may be internal and include metal or dielectric coatings on the planes, or the reflecting surfaces may be external and effect total internal reflection. The semiconductor single crystal may include monolithic logic circuits and it may include a PN junction photodetector means for sensing the laser beam.

The invention also features a ring laser gyroscope including a semiconductor single-crystal external ring resonator cavity having a plurality of reflecting surfaces defined by the planes of the crystal and establishing a closed optical path. There is also a discrete laser medium disposed in the semiconductor single crystal external ring resonator cavity for generating coherent light in the cavity in both directions along the optical path. There are means for detecting the interference pattern generated by the interference of the beams propagating along the optical path and representing the rotation of the crystal cavity relative to the beams.

Other objects, features and advantages will occur to those skilled in the art from the following description of a preferred embodiment and the accompanying drawings, in which.

Figure 1:
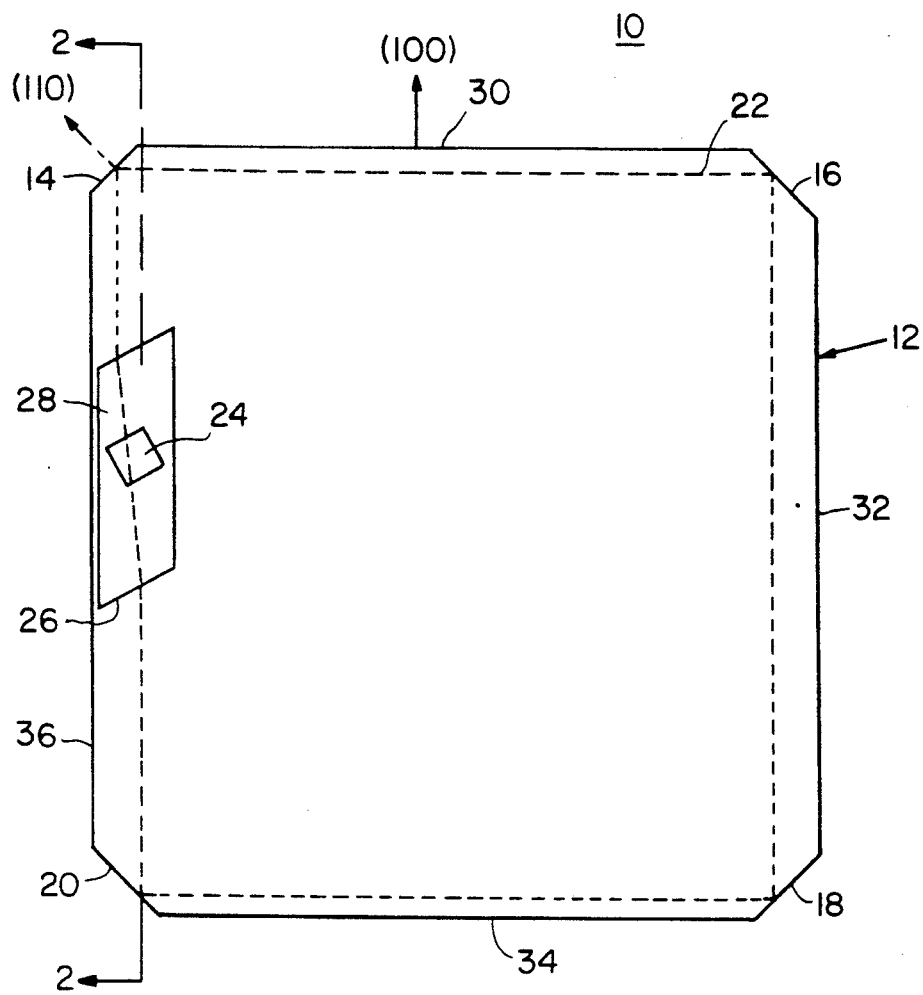
FIG. 1 is a top plan schematic view of a ring laser according to this invention.

The invention may be accomplished with a ring laser including a semiconductor external ring resonator cavity having a plurality of reflecting surfaces defined by the planes of the crystal and establishing a closed optical path. The crystal may be made of silicon, silicon carbide, diamond, germanium, gallium arsenide, gallium phosphide, or any other of the many III-V materials or other single crystal substance. A discrete laser medium is disposed in the semiconductor single crystal external ring resonator for generating coherent light in the cavity. There may be any number of reflecting surfaces to define the optical path of the cavity. In fact, the number of reflecting surfaces may be only two, in which case the ring is collapsed into a line terminated by two parallel mirrors, and in such a case the external cavity can be used mainly for obtaining narrow spectral linewidth in a miniature laser. When there are four reflecting surfaces, for example, they may be arranged in orthogonal pairs of parallel spaced surfaces: that is, there are two opposing pairs arranged orthogonal to one another. The crystal planes along which the reflecting surfaces are defined may be the [110] planes or equivalent, indicated as {110}. The laser medium may be a semiconductor material which can be wholly separate and independent from the material of the semiconductor single crystal external resonant cavity, so that the two are totally decoupled and independent and thus the spectral linewidth may be independently controlled and much narrower, and the geometry and material of the one does not depend upon the other except insofar as their index of refractions need to match or be otherwise compensated for. Even that requirement may be eliminated if the backscattering is minimized, for example, by placing the optical surfaces of the laser medium at Brewster's angle to the optical path in the cavity.

In contrast, not only may the semiconductor material comprising the laser medium be made of a different material from the single crystal resonator cavity but also, if desired, the laser medium semiconductor material may be the same material and may in fact be grown epitaxially on the very semiconductor crystal itself. Alternatively, the laser medium need not be a solid medium; it can be a fluid medium. For example, the cavity may include a gastight chamber and the laser medium may be a gas disposed in that chamber. The chamber may encompass the entire cavity or may be formed in only a portion of it, in which case the chamber would include windows with provision against reflection and backscattering, or there may be an index matching medium between the laser medium and the optical path. The optical path may extend through the semiconductor single crystal external ring resonator cavity. Alternatively, there there may be a channel cut or etched into the semiconductor single crystal external ring resonator cavity, and the optical path may extend in that channel. In such a case, in order to reduce undesired reflections, the side walls may be coated with an absorbing material. The desired reflecting surfaces may be internal surfaces in the channel and may include metal or dielectric coatings on the planes which form the reflecting surfaces. Alternatively, the reflecting surfaces may be external and the reflection may be affected by the total internal reflection at the crystal planes which form the reflecting surfaces. The semiconductor single crystal nature of the external ring resonator cavity enables the crystal to function as a host for any desired monolithic logic circuits which can be fabricated integral with it using conventional microelectronic fabrication processes. In fact, a photodetector means, which can be used when the ring laser is operating as a ring laser gyroscope, can be fabricated, for example, as a PN junction photodetector using the material of the semiconductor single crystal external ring resonator cavity.

A ring laser gyroscope may be very conveniently made from the ring laser simply by having the laser medium provide beams in both directions along the optical path. The counter-rotating beams form an interference pattern which is then sensed by a detector as a representation of the rotation of the crystal cavity relative to the beams, in accordance with the well-known Sagnac effect. The decoupling of the external cavity and the laser also permits the laser to be designed in a manner that facilitates bidirectional beam propagation without mode competition, since the cavity and laser gain materials may differ. For example, the cavity may comprise a semiconductor crystal such as gallium phosphide, and the laser gain medium may comprise HeNe of an isotopic composition that facilitates bidirectional modes. In analogy, a semiconductor laser that facilitates bidirectional mode propagation may be created and introduced into the cavity in like manner.

Figure 2:
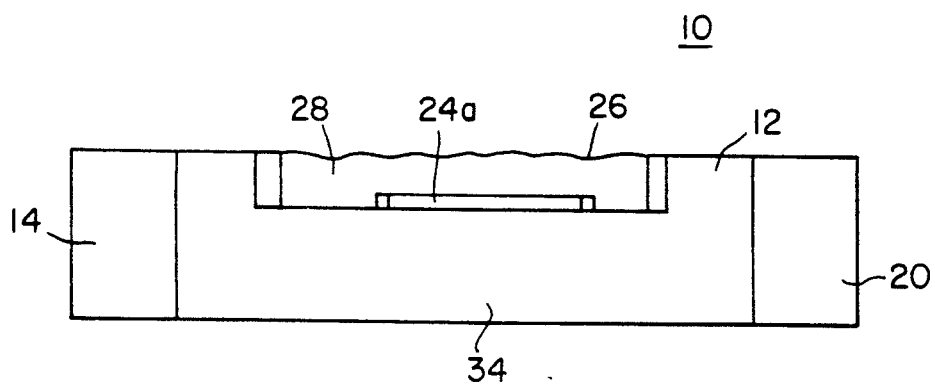
FIG. 2 is a side elevational sectional view taken along line 2—2 of FIG. 1.

There is shown in FIG. 1 a ring laser 10 according to this invention including a semiconductor single crystal external ring resonator cavity 12 having a plurality of reflecting surfaces 14, 16, 18 and 20 which have been cleaved along the {110} planes of the crystal to establish a closed optical path 22. Small semiconductor laser 24 is installed on crystal 12 in chamber 26 and a matching medium 28 such as a transparent epoxy (or non-linear optical material) which has an index of refraction 1.5 for matching the index of refraction in the range of 3 to 4 of single crystal 12 with the index of refraction in the range of 3 to 4 associated with laser 24, with the laser 24 positioned at Brewster's angle to optical path 22 as indicated by the orientation of laser 24. The side surfaces 30, 32, 34 and 36 which do not provide reflecting surfaces for optical path 22, have been cleaved along crystal planes [100] or equivalent {100}. Laser 24 may be separate and discrete in terms of its geometry and material from crystal 12, or it may be the same material. It may even be epitaxially grown on crystal 12 itself as indicated in FIG. 2, where laser medium 24a is an epitaxial structure formed of InGaAs (indium gallium arsenide) on single crystal 12 which is formed of InP (indium phosphide).

Figure 3:
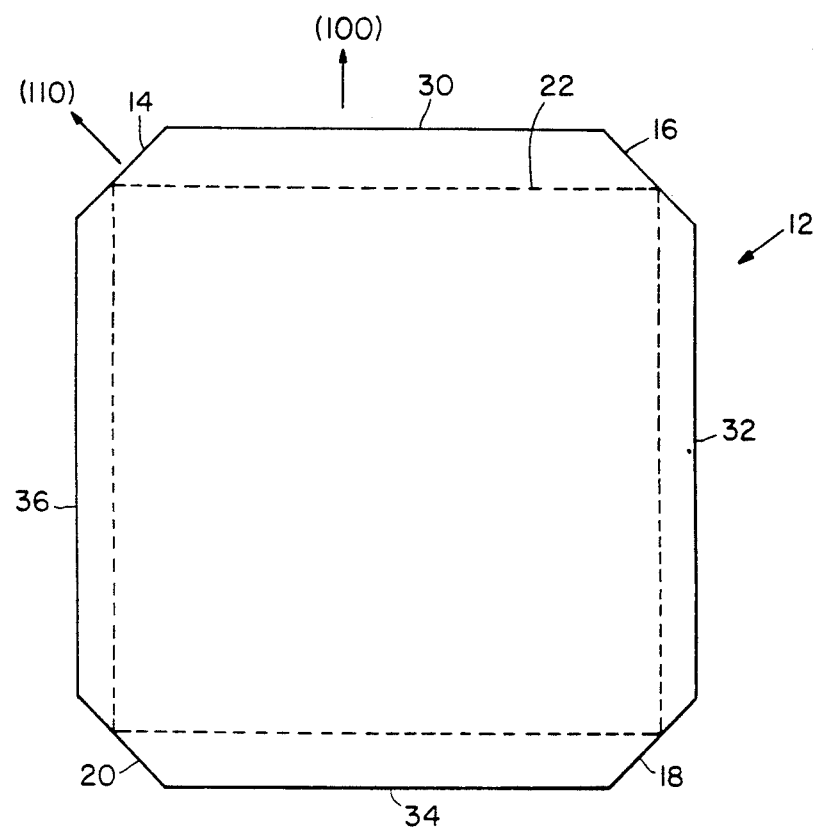
FIGS. 3, 4 and 5 are top plan views similar to that in FIG. 1 showing three different cleavings of a crystal.
Figure 4:
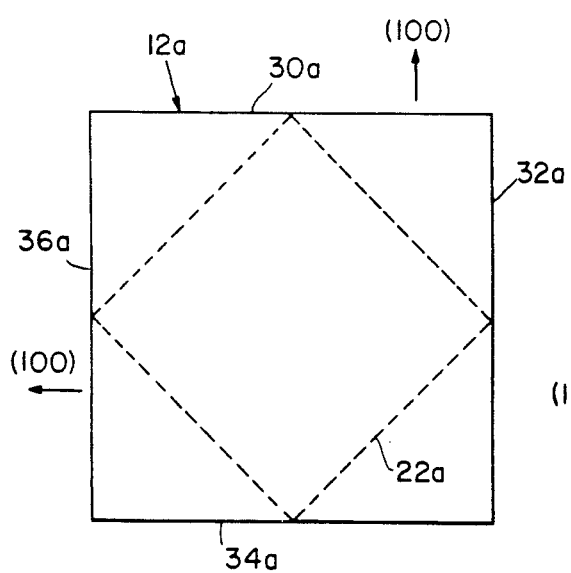
Figure 5:
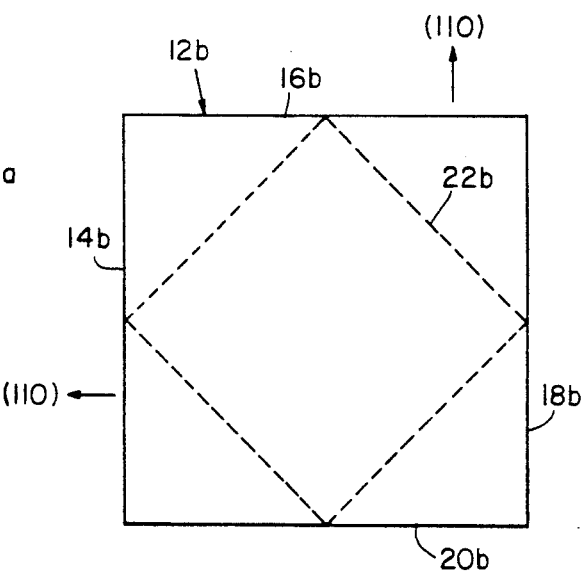
Figure 6:
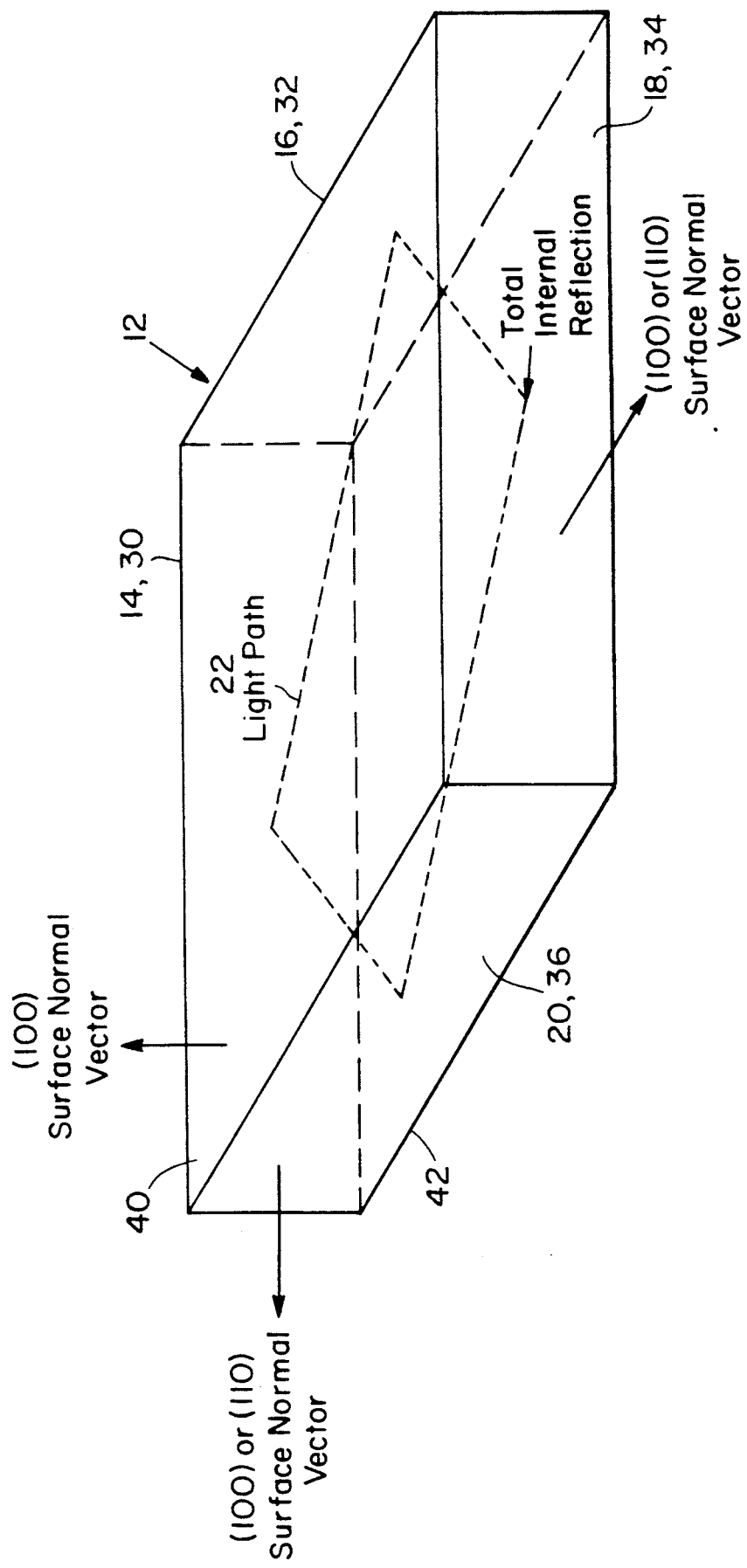
FIG. 6 is a diagrammatic three-dimensional view of the crystal of FIG. 4.

The cleaving of crystal 12, as shown again in FIG. 3, is along the {100} planes of the crystal and the {110} planes, with the surfaces created along the {110} planes constituting the reflecting surfaces, but this is not a necessary limitation of the invention. For example, as shown in FIG. 4, crystal 12a may be cleaved simply along crystal planes {100} so that surfaces 30a, 32a, 34a and 36a provide the same total internal reflection as in crystal 12, FIG. 3, to create an optical path 22a. Or, as shown in FIG. 5, crystal 12b may be cleaved along crystal planes {110} to create reflecting surfaces 14b, 16b, 18b and 20b to form optical path 22b. Alternatively, any number of various crystal plane configurations can be utilized to form the closed optical path 2 by using patterned etching techniques to select and form properly oriented crystal surfaces. In each case the path is created by the effect of total internal reflection within crystal 12. The total internal reflection is affected when the angle of incidence, $\theta$, is greater than the critical angle for total internal reflecting, $\theta_c$, according to the formula $\sin\theta_c = n_1/n_2$, where $n_1$ is the index of refraction of the external media and $n_2$ is the index of refraction of the semiconductor. In FIGS. 1-5, the optical path 22 propagates through the material of crystal 12 itself as indicated in FIG. 6, where the total internal reflection can take place at the crystal planes {100} or {110}. In FIG. 6 as shown the reflecting surface can be either crystal plane [100] or [110] and the upper 40 and lower crystal surfaces may be other members of the set of equivalent {100}, {110}, or other planes.

Figure 7:
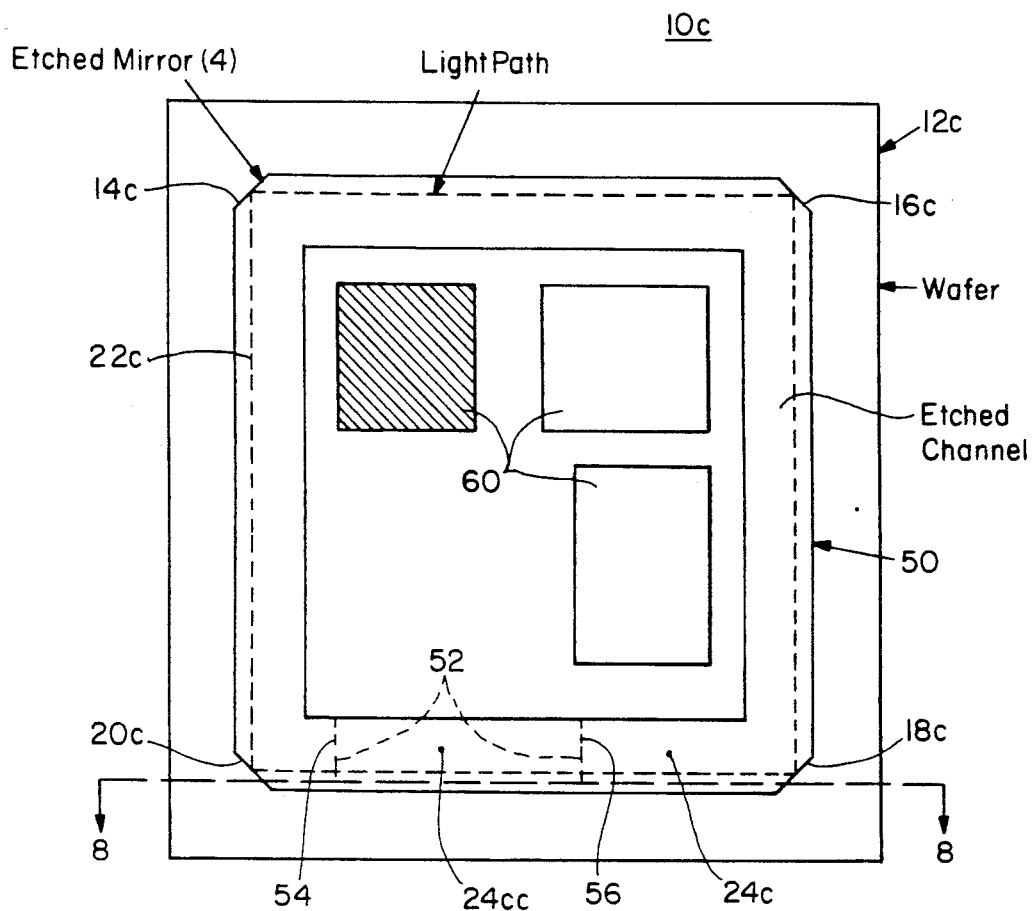
FIG. 7 is a top plan view of an alternative construction of a ring laser according to this invention with a recessed channel etched in the crystal and showing on-board logic circuits monolithically fabricated with the crystal itself.

The light path need not propagate through the crystal material itself. For example, as shown in FIG. 7, crystal 12c of ring laser 10c may have a channel 50 etched or carved out of it. Again, there may be four reflecting surfaces 14c, 16c, 18c and 20c formed by cleaving crystal 12c along the [100] or [110] planes. The optical path 22c thus created exists in the air or other medium provided in channel 50. The laser 24c may simply include a lasing gas disposed in channel 50, or there may be a chamber 52 occupying just a portion of channel 50. In that case the gas 24cc may be confined to chamber 52, and chamber 52 may be provided with windows 54 and 56 which may, for example, be positioned at Brewster's angle in order to eliminate backscattering. In that case the chamber 52 constitutes the lasing medium 24cc. Alternatively, the lasing medium may comprise other optically pumped materials such as Nd-YAG.

Since crystal 12c is a semiconductor crystal, conventional microelectronic fabrication processes can be used to create right on and in crystal 12c various circuits 60 including logic circuits, microprocessors and photodetecting sensors which can be used to sense interference patterns and process the data therefrom, for example, when ring laser 10 or 10c is used as a ring laser gyroscope, as is discussed subsequently.

Figure 8:
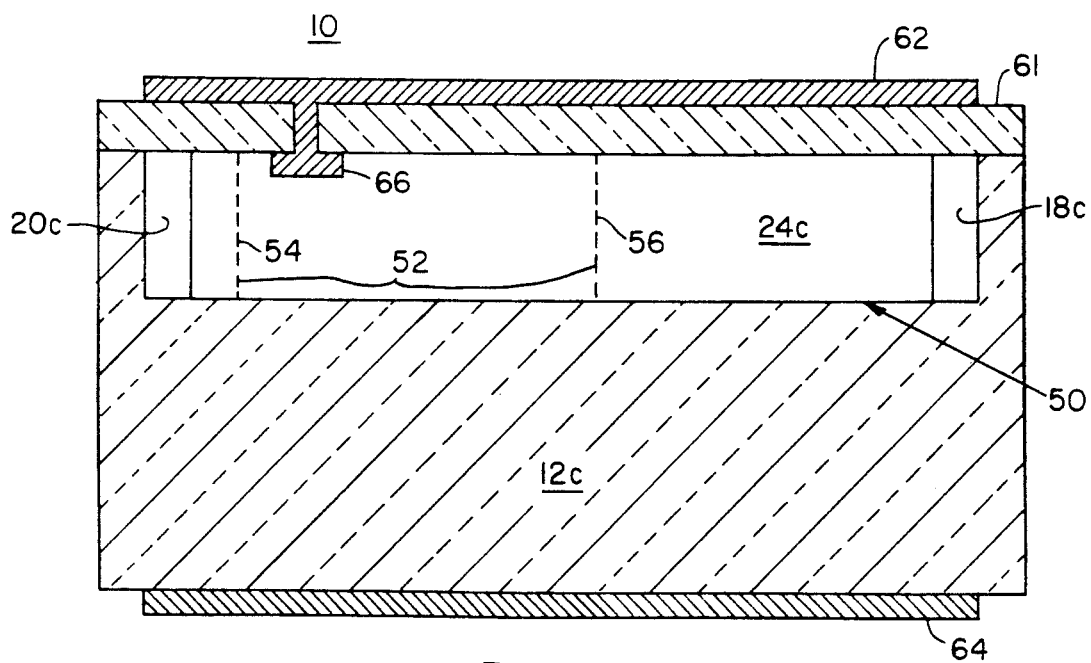
FIG. 8 is a side elevational sectional view along line 8—8 of the ring laser of FIG. 7 with a cover plate and electrodes installed.
Figure 9:
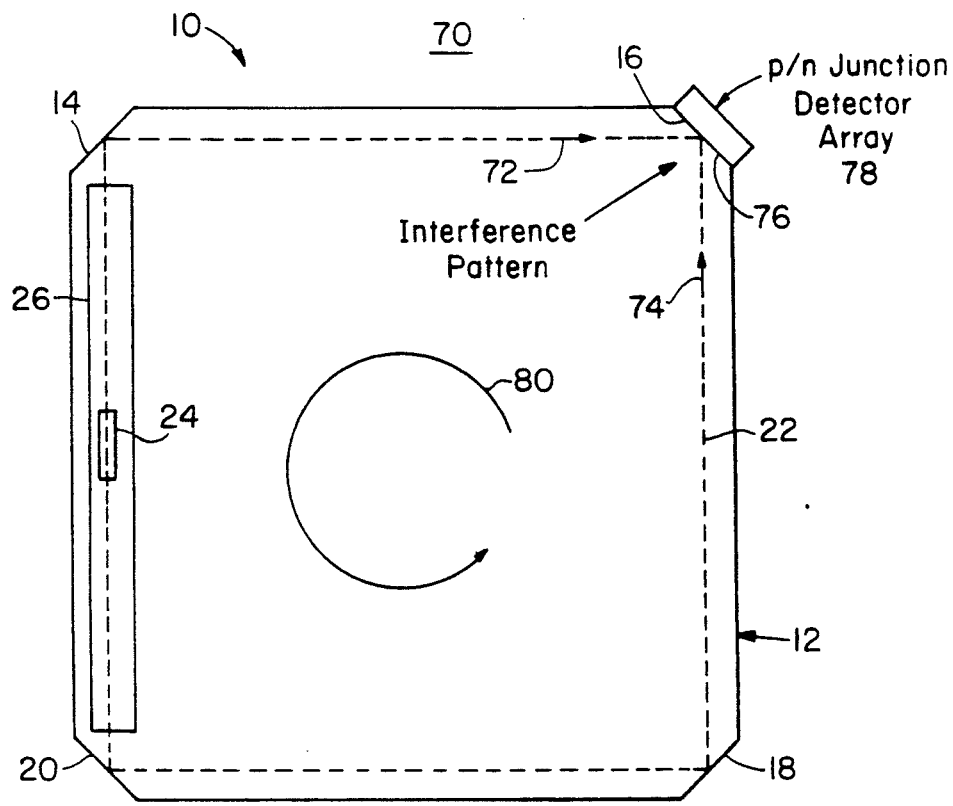
FIG. 9 is a top plan view of a ring laser similar to that shown in FIG. 1 implementing a ring laser gyroscope with bidirectional laser beams and an interference pattern detector.
Figure 10:
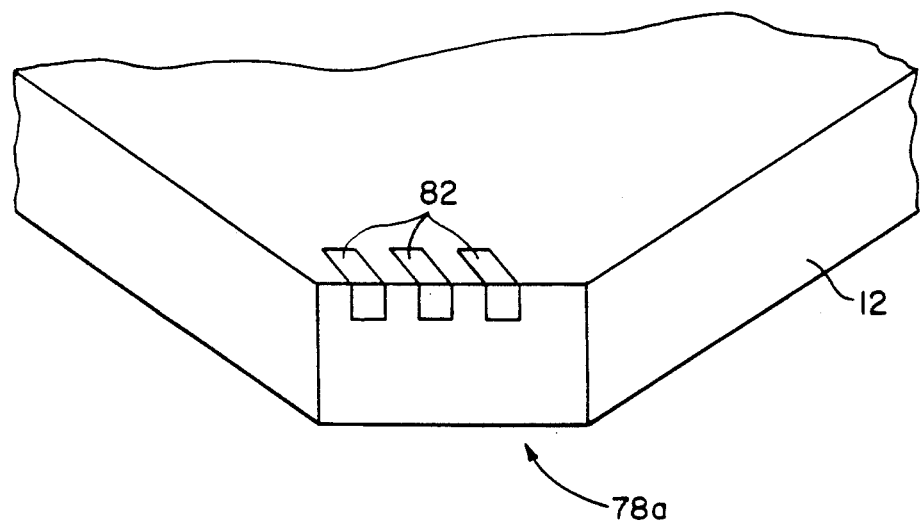
FIG. 10 is an enlarged detailed broken-away portion of an alternative detector array constructed integrally with the crystal.

Channel 50 may be sealed by a glass layer or a plate 61, FIG. 8, and the electric field may be applied through electrodes 62 and 64. Electrode 62 may have a terminal 66 which extends through glass 61 if glass 61 is an insulator, into channel 50, or into chamber 52. Ring laser 10 may be operated as a ring laser gyroscope 70, FIG. 9, by simply enabling laser medium 24 to provide two counter-rotating beams 72, 74 along optical path 22. These beams create an interference pattern 76 at reflecting surface 16, where there is positioned a PN junction detector array 78 which detects that interference pattern. Any relative rotation indicated at arrow 80 creates a shift in the interference pattern which may be detected as a representation of the relative rotation between the beams and crystal 12. Using conventional microelectronic fabrication techniques, the entire ring laser 10, and in fact the entire ring laser gyroscope, may be fabricated on a single chip no larger than approximately 1 cm² and, as indicated previously, may include all necessary circuitry right on board and even integrally, monolithically, fabricated with crystal 12. Even the PN junction detector array 78 may be fabricated by P-type diffusion 82, FIG. 10, on a crystal 12 which is formed from an N type wafer. Although the embodiment shown uses four reflective surfaces, more or fewer surfaces could be used. For example, one of the surfaces 14, 16, 18, 20 could be eliminated and the crystal adapted to form a three-surface device, or two of the surfaces could be eliminated and the crystal could be adapted for use in a degenerate ring. A semiconductor external cavity for a Fabry-Perot two mirror resonator could be utilized for non-gyroscope applications.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A ring laser comprising:
a semiconductor single crystal external ring resonator cavity having a plurality of reflecting surfaces defined by the planes of the crystal and establishing a closed optical path; and
a discrete laser medium disposed in said semiconductor single crystal external ring resonator cavity for generating coherent light in said cavity, wherein said resonator cavity is decoupled from the laser medium.

2. The ringer laser of claim 1 in which there are three said reflecting surfaces.

3. The ring laser of claim 1 in which there are two said reflecting surfaces.

4. The ring laser of claim 1 in which there are four said reflecting surfaces arranged in orthogonal pairs of parallel spaced surfaces.

5. The ring laser of claim 1 in which said crystal planes are the {110} planes.

6. The ring laser of claim 1 in which said laser medium is a semiconductor material.

7. The ring laser of claim 6 in which said semiconductor material is grown epitaxially on said semiconductor crystal.

8. The ring laser of claim 1 in which said cavity includes a gastight chamber and said laser medium is a gas disposed in said chamber.

9. The ring laser of claim 8 in which said chamber is coextensive with said cavity.

10. The ring laser of claim 8 in which said chamber occupies only a portion of said cavity and said chamber includes windows.

11. The ring laser of claim 1 further including an index matching medium between said laser medium and said optical path.

12. The ring laser of claim 1 in which said laser medium is oriented at Brewster's angle with respect to the optical path.

13. The ring laser of claim 1 in which said optical path extends through said semiconductor single crystal external ring resonator cavity.

14. The ring laser of claim 1 in which there is a channel in said semiconductor single crystal external ring resonator cavity and said optical path extends through said channel.

15. The ring laser of claim 1 in which said reflecting surfaces are internal and include metal or dielectric coatings on said planes.

16. The ring laser of claim 1 in which said reflecting surfaces are external and effect total internal reflection.

17. The ring laser of claim 1 in which said semiconductor single crystal is a host for monolithic logic circuits fabricated integral with it.

18. The ring laser of claim 1 in which said semiconductor single crystal includes a PN junction photodetector means.

19. A ring laser gyroscope comprising:
a semiconductor single crystal external ring resonator cavity having a plurality of reflecting surfaces defined by the planes of the crystal and establishing a closed optical path;
a discrete laser medium disposed in said semiconductor single crystal external ring resonator cavity for generating coherent light in said cavity in both directions along said optical path, wherein said resonator cavity is decoupled from the laser medium; and
means for detecting the interference pattern generated by the interference of said beams propagating along said optical path representing the rotation of said crystal cavity relative to said beams.

* * * * *